United States Patent
Hegde

(10) Patent No.: US 10,121,652 B1
(45) Date of Patent: Nov. 6, 2018

(54) FORMATION OF METAL OXIDE LAYER

(71) Applicant: NXP USA, INC., Austin, TX (US)

(72) Inventor: Rama I. Hegde, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/615,884

(22) Filed: Jun. 7, 2017

(51) Int. Cl.
*C23C 16/40* (2006.01)
*H01L 21/02* (2006.01)
*C23C 16/44* (2006.01)

(52) U.S. Cl.
CPC ...... *H01L 21/02172* (2013.01); *C23C 16/405* (2013.01); *C23C 16/4404* (2013.01); *H01L 21/0226* (2013.01); *H01L 21/02318* (2013.01)

(58) Field of Classification Search
CPC ......... C23C 16/40; C23C 16/08; C23C 16/30; B05D 3/02
See application file for complete search history.

(56) References Cited

U.S. PATENT DOCUMENTS

| | | | | |
|---|---|---|---|---|
| 3,546,128 A | * | 12/1970 | Rabatin | C09K 11/777 252/301.4 H |
| 4,931,312 A | * | 6/1990 | de Leeuw | C09K 11/08 427/157 |
| 5,024,859 A | | 6/1991 | Millard et al. | |
| 5,786,031 A | * | 7/1998 | Retallick | C23C 28/00 423/213.2 |
| 6,250,540 B1 | * | 6/2001 | Egitto | B23K 1/206 219/85.21 |
| 2004/0011380 A1 | * | 1/2004 | Ji | B08B 7/00 134/1.1 |
| 2004/0168627 A1 | * | 9/2004 | Conley, Jr. | C30B 25/02 117/89 |
| 2006/0094603 A1 | * | 5/2006 | Li | C23C 18/1216 505/445 |
| 2008/0076066 A1 | * | 3/2008 | Watanabe | G03F 7/031 430/286.1 |
| 2014/0286855 A1 | * | 9/2014 | Desmedt | B01J 23/464 423/584 |
| 2015/0132563 A1 | * | 5/2015 | O'Malley | B05D 3/0254 428/312.8 |
| 2015/0263122 A1 | * | 9/2015 | Hsiao | H01L 29/515 257/401 |

FOREIGN PATENT DOCUMENTS

| | | | |
|---|---|---|---|
| JP | 3-26276 | * | 2/1991 |
| JP | 2001-261464 | * | 9/2001 |
| JP | 2001-261465 | * | 9/2001 |

OTHER PUBLICATIONS

Zhao, Li, et al., "Oxyhalides: A new class of high-Tc multiferroic materials". Sci. Adv. 2016; 2:e1600353, May 27, 2016, pp. 1-5.*

(Continued)

*Primary Examiner* — Bret P Chen

(57) ABSTRACT

A method for forming a metal oxide layer on a wafer. In some embodiments, the method includes forming a layer of a metal oxyhalide on a wafer followed by an anneal of the wafer which removes halogens from the layer to form a layer of metal oxide. A semiconductor device may be formed from the wafer.

20 Claims, 3 Drawing Sheets

(56) References Cited

OTHER PUBLICATIONS

Kim, Sung-Wook, et al., "Structure Stabilization by Mixed Anions in Oxyfluoride Cathodes for High-Energy Lithium Batteries". ACSNano, vol. 9, No. 10, 10076-10084, 2015.*
Tsujimoto, Yoshihiro, et al., "Extended Ni(III) Oxyhalide Perovskite Derivatives: Sr2NiO3X (X=F,Cl)" Inorganic Chemistry, 2013, 52, 10211-10216.*
Li, Jie, et al., "Bismuth oxyhalide nanomaterials: layered structures meet photocatalysis". Nanoscale, 2014, 6, 8473-8488.*
Purkayastha, B.C., et al., "Co-Separation of Hafnium with Zirconium Oxychloride using 175,181Hf as Radioactive Tracer". Journal of Radioanalytical Chemistry, vol. 22 (1974) 83-93.*
Zhao, Li, et al., "Oxyhalides: A new class of high-Tc multiferric materials". Sci. Adv. 2016; 2:e1600353, May 27, 2016, pp. 1-5.*
Conley, J.F. Jr., et al. "Alternating Pulse Deposition of High-k Metal Oxide Thin Films using Hf(NO3)4 as Metal and an Oxygen Source with Multiple in-situ Annealing", Electrochemical Society Proceedings, vol. 2003-22 (2003).
Delabie, A., et al., "Atomic layer deposition of hafnium based gate dielectric layers for CMOS applications", The Electrochemical Society, 212th ECS Meeting, Abstract #999 (2007).
Hegde, R. I., et al., "Sub-9Å equivalent oxide thickness scaling using hafnium zirconate dielectric with tantalum carbide gate", Journal of Applied Physics 104, 094110 (2008).
Shi, X., et al., "Development of ALD HfZrOx with TDEAH/TDEAZ and H2O", Journal of the Electrochemical Society, 158, H69-H74 (2011).

\* cited by examiner

FORMATION OF METAL OXIDE LAYER

BACKGROUND OF THE INVENTION

Field of the Invention

This invention relates to a method for making a metal oxide layer on a wafer.

Description of the Related Art

Metal oxides are utilized for semiconductor devices such as transistors. In some examples, metal oxides can be used as gate dielectric layers that have a higher dielectric constant than silicon dioxide.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Described herein are methods for forming a metal oxide layer on a wafer. In some embodiments, the methods include forming a layer of metal oxyhalide on a wafer followed by an anneal of the wafer which removes halogens from the layer to form a densified layer of metal oxide. In some embodiments, the layer of metal oxyhalide is formed on a wafer in a chamber by a number of metal oxyhalide deposition operations, each of which is followed by an inert gas purge operation in the chamber. Afterwards, the wafer is annealed to remove halogens from the layer of metal oxyhalide.

In some embodiments, the processes described herein allow for the formation of a metal oxide layer on a wafer without the use of a separate oxidizing agent such as water or ozone. Some conventional metal oxide formation processes utilize an oxidizing agent (e.g. water, deuterium oxide (D2O), ozone) and a metal halide precursor (e.g. $HfCl_4$, $ZrCl_4$). Providing a process for forming a metal oxide layer without the use of an oxidizing agent may in some embodiments, reduce the number of operations needed to form a metal oxide layer.

Figure 1:
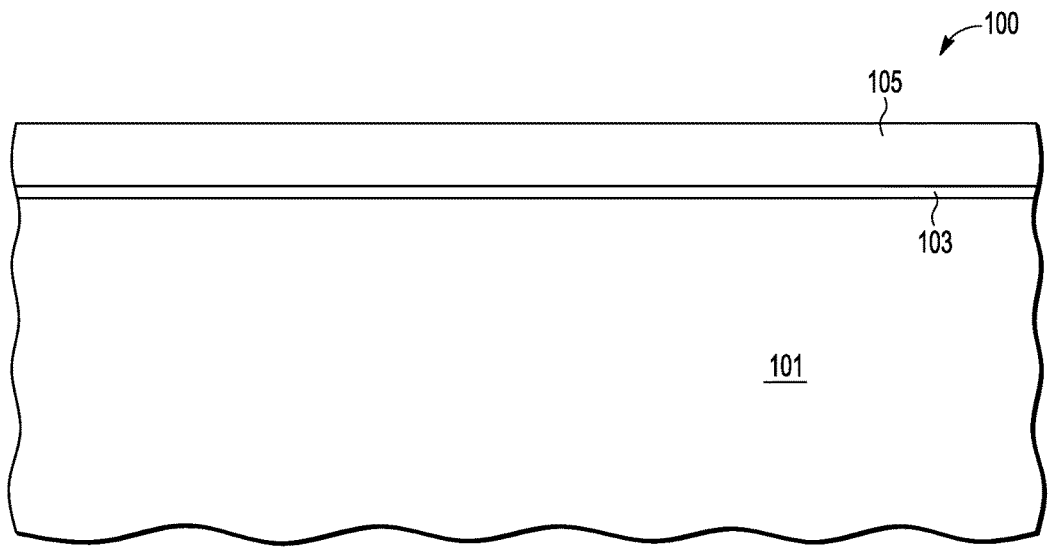
FIGS. 1-3 set forth cutaway side views of various stages in the formation of a semiconductor device according to one embodiment of the present invention.

FIG. 1 sets forth a partial cross sectional side view of a wafer 100 during a stage in the manufacture of a semiconductor device according to one embodiment of the present invention. Wafer 100 includes a substrate 101, which in the embodiment shown, is made of a bulk monocrystalline semiconductor material such as, e.g., silicon, silicon germanium, silicon carbon, gallium nitride, gallium arsenic, another III-V semiconductor material, or another type of semiconductor material. In some embodiments, substrate 101 may include conductivity dopants (N-type and P-type) implanted or formed in-situ. The conductivity dopants may be selectively implanted to form semiconductor device regions in the wafer. Wafer 100 may also include isolation structures (not shown) for isolating the different active regions from each other. In other embodiments, substrate 101 may have a semiconductor on insulator (SOI) configuration where a buried dielectric layer (e.g. $SiO_2$) is located between an upper active semiconductor layer and a base semiconductor substrate (not shown in FIG. 1).

A thin layer 103 (e.g. 5 angstroms or less) of native oxide is formed on substrate 101 from its exposure to atmosphere. In some embodiments, layer 103 can be thicker and formed from an intentional oxidation or deposition process. In other embodiments, layer 103 is not present.

A layer 105 of metal oxyhalide is formed on layer 103. In one embodiment, layer 105 is formed in a deposition chamber (e.g. 402 of FIG. 4) by the introduction of metal oxyhalide in gaseous form into the chamber at an elevated temperature. In some embodiments, the material of layer 105 is deposited by an atomic layer deposition process with multiple metal oxyhalide deposition operations (also known as "pulses") with each pulse followed by a purging operation with an inert gas.

Some examples of a metal oxy halide material of layer 105 include hafnium oxychloride ($HfOCl_2$), hafnium oxybromide ($HfOBr_2$), hafnium oxyiodide ($HfOI_2$), hafnium oxyfluoride ($HfOF_2$), zirconium oxychloride ($ZrOCl_2$), zirconium oxybromide ($ZrOBr_2$), zirconium oxyiodide ($ZrOI_2$), zirconium oxyfluoride ($ZrOF_2$), lanthanum oxychloride ($La(ClO_4)_3$), lanthanum oxybromide ($La(BrO_3)_3$), and lanthanum oxyiodide ($La(IO_3)_3$), lanthanum oxyfluoride ($La(FO_3)_3$). In other embodiments, the metal oxyhalide may include other types of metals such as Al, Sc, Ti, V, Y, Ta, W, Ce, Gd, etc. and/or include other types of halogens.

In one embodiment, layer 105 is made of a single metal oxyhalide material (e.g. hafnium oxychloride). In other embodiments, layer 105 may include a number of different metal oxyhalide materials (e.g. hafnium oxychloride and zirconium oxychloride). In one embodiment, the different metal oxyhalide materials may be located in contiguous separate layers of layer 105. In other embodiments, each pulse of a metal oxyhalide may include a different metal oxyhalide material from the previous pulse.

In one embodiment, layer 105 has a thickness in the range of 10 to 100 angstroms, but may have different thicknesses in other embodiments. In some embodiments, each pulse of metal oxyhalide adds a thickness of material in the range of 0.1 to 1 angstroms to the thickness of layer 105. However, each pulse may add a different thickness of material in other embodiments.

Figure 2:
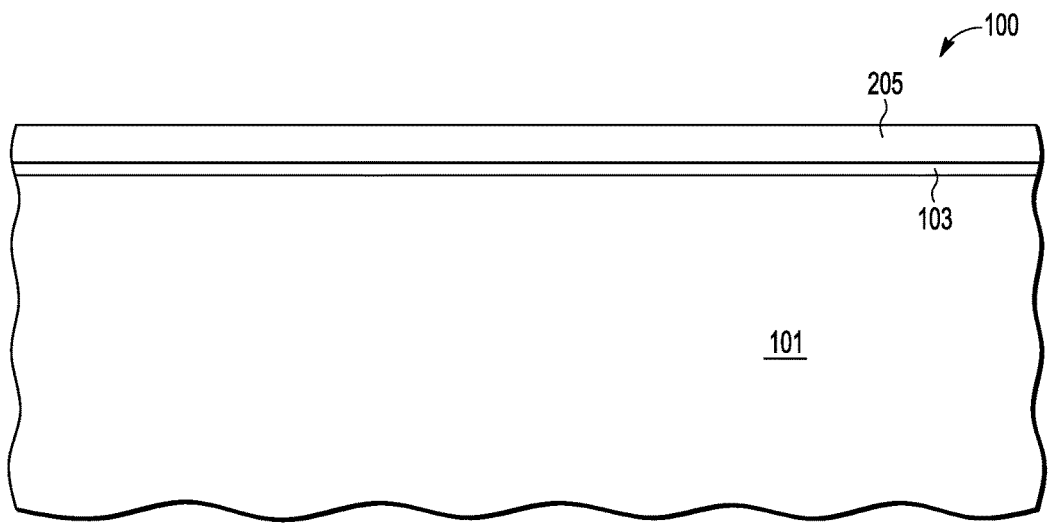

FIG. 2 is a partial cutaway side view of wafer 100 after wafer 100 has been annealed to remove the halogens (e.g. chlorine, bromine, iodine, fluorine) of the metal oxyhalide layer 105 and other impurities from layer 105 to form a metal oxide layer 205. In one embodiment, during the anneal process, wafer 100 is heated to a temperature in the range of 350 C to 1100 C for a period of time in the range of 1 second to 60 seconds, but may be heated to other temperatures and/or for other times in other embodiments. It is believed that the heating of wafer 100 causes the unreacted halogens to evaporate from layer 105 and also causes the unreacted metal and oxygen to form a metal oxide. Some possible reactions with the metal oxyhalide layer during the annealing process are as follows:

$$HfOCl_2 \rightarrow HfO_2(S) + Cl_2(g);$$

$$HfOBr_2 \rightarrow HfO_2(S) + Br_2(g);$$

$$ZrOCl_2 \rightarrow ZrO_2(S) + 0l_2(g);$$

$$ZrOBr_2 \rightarrow ZrO_2(S) + Br_2(g);$$

where S=solid, g=gas.

During the annealing process, layer 105 densifies into layer 205 wherein the thickness of layer 205 is reduced from the thickness of layer 105 as a result of the densification process. In one embodiment, the thickness of layer 205 is reduced by a percentage in the range of 10-35% from the thickness of layer 105.

Figure 3:
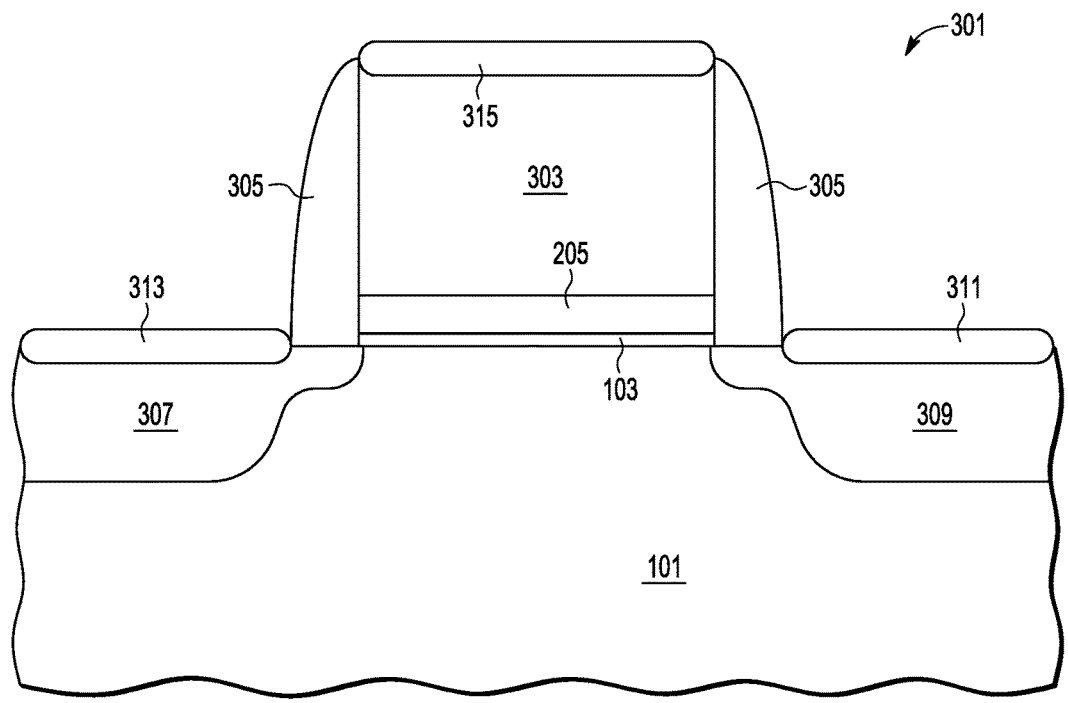

FIG. 3 is a partial cutaway side view of wafer 100 after a transistor 301 has been formed. After the annealing process, a layer of gate material (e.g. doped polysilicon, metal) is formed on layer 205. The layer of gate material, layer 205, and layer 103 are then patterned by a photolithographic process to form a gate stack with gate 303. The remaining portions of layers 103 and 205 form the gate dielectric for transistor 301. After the patterning of the gate material layer, sidewall spacer 305 is formed. Source/drain regions 307 and 309 are then formed by implanting conductivity dopants into substrate 101. Afterwards silicide structures 313, 311 and 315 are formed by reacting a metal with the exposed silicon. Other processes may be performed in the forming of transistor 301 such as other etching, implanting, and cleaning processes.

After the stage shown in FIG. 3, interconnect layers (not shown) are formed over wafer 100. The interconnect layers include metal interconnects and conductive vias (not shown) to electrically couple the silicide structures (313, 315, 311) of the transistors of wafer 100 together to form circuitry and to external terminals such as bond pads that are formed over the interconnect layers. The interconnect layers include dielectric material that electrically isolates the interconnect structures and vias from each other. Afterwards, wafer 100 is singulated into multiple integrated circuit die with each die including multiple transistors similar to transistor 301.

The die are then packaged with an encapsulant to form an integrated circuit packages that can be utilized in electronic systems such as computers, cell phones, appliances, communication equipment, and an automobile control systems.

In other embodiments, a wafer may include other devices, structures, and/or be processed by other processes. Also in other embodiments, devices of a wafer may be physically implemented in electronic systems in other configurations.

In the embodiment of FIG. 3, metal oxide layer 205 is utilized as a gate dielectric for a planar MOSFET transistor 301. However, in other embodiments, a metal oxide layer formed by the methods described herein can be used in other structures and/or for other semiconductor devices in other embodiments. For example, a metal oxide layer can be used as a dielectric liner either on the substrate or in the interconnect layers, a dielectric layer separating two electrodes of a capacitor, a structure of a memory cell, or a dielectric layer in a standalone electronic component such as resistor, capacitor, or inductor. For example, a metal oxide layer as formed by the methods described herein can be used with other types of transistors such as LDMOS, bipolar, finFETS, GaAs devices or GaN devices. Also, a metal oxide layer can be used in the devices such as quantum well transistors and tunnel FETS.

Figure 4:
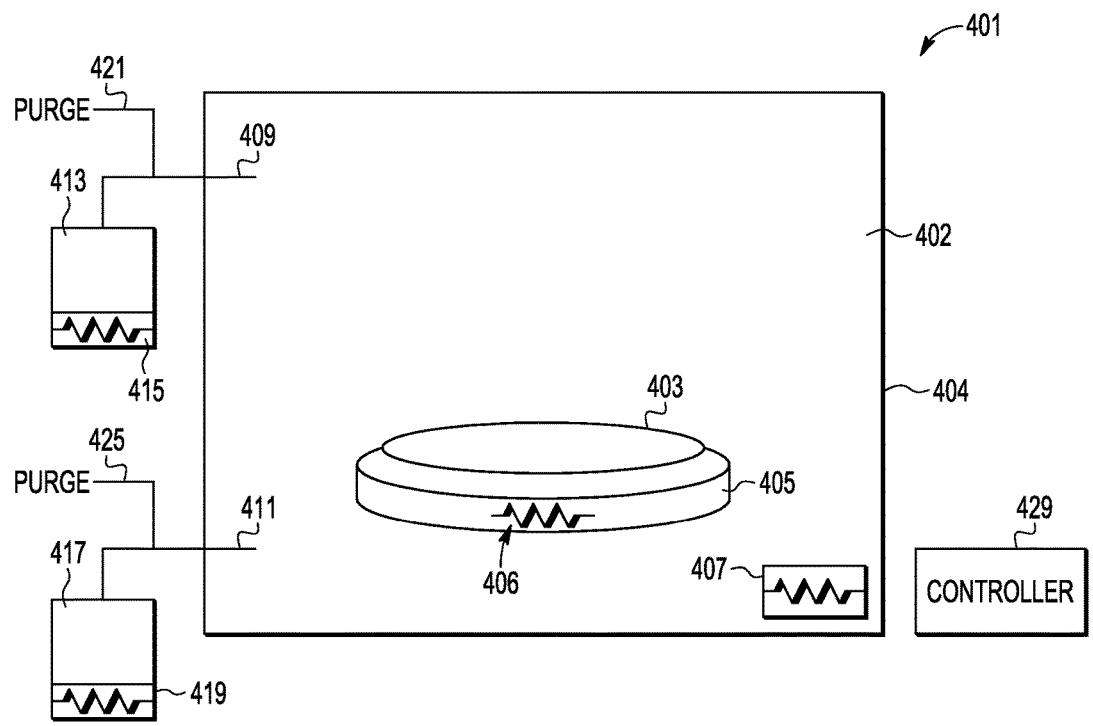
FIG. 4 is a schematic view of a wafer processing system.

FIG. 4 is a schematic view of a wafer processing system 401 that can be used to form a metal oxide layer similar to layer 205 on a wafer. System 401 includes a wafer chamber 402 where a wafer (e.g. 403) attached to a wafer chuck 405 is processed therein. The chamber 402 includes chamber walls 404. System 401 includes a controller 429 for controlling the operations of system 401. Located in chamber 402 is a heating element 407 for elevating the temperature of the chamber walls during wafer processing. Wafer chuck 405 includes a heating element 406 for elevating a temperature of the wafer during processing.

Chamber 402 includes inlets 409 and 411 for receiving precursors in a gaseous form for forming structures on a wafer. In the embodiment shown, inlet 409 is coupled to canister 413 and inlet 411 is coupled to canister 417. Each of canisters 413 and 417 is heatable by a heating element 415 and 419, respectively, to heat the precursors in the canisters to a gaseous form for flowing into chamber 402. In one embodiment, each canister 413 and 417 would include a metal oxyhalide in a solid or liquid state that is heated to a gaseous state to flow into chamber 402 to be deposited on wafer 403. Each inlet 409 and 411 includes a purge line 421 and 425, respectively, for providing inert gases (e.g. nitrogen, argon) for purging inlets 409 and 411 and chamber 402. In other embodiments, other types of wafer processing systems can be used to form a metal oxide layer. System 101 may also include an exhaust outlet (not shown).

Figure 5:
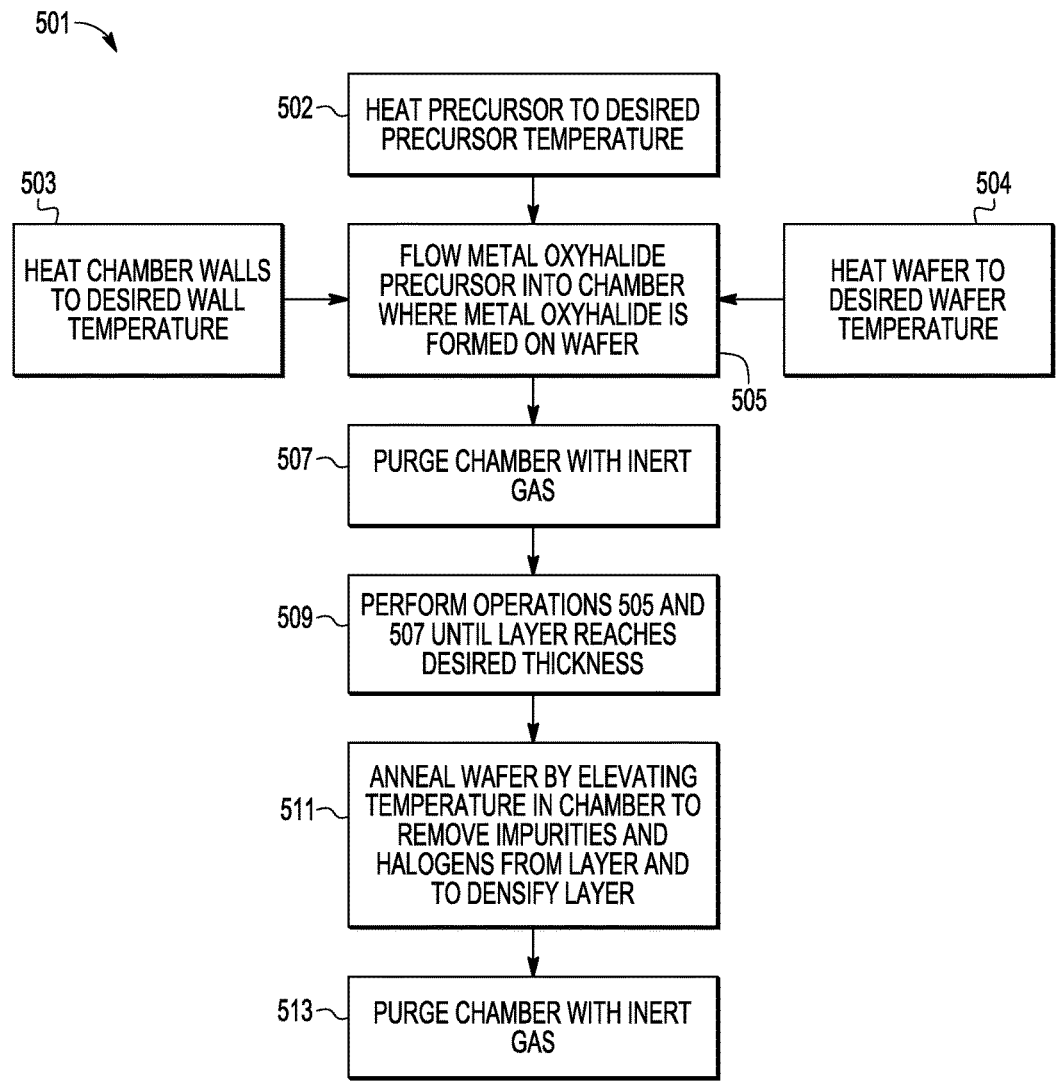
FIG. 5 is a flow diagram of a process for forming a metal oxide according to one embodiment of the present invention.

FIG. 5 is a flow diagram of a process 501 for forming a metal oxide layer on a wafer according to one embodiment of the present invention. In the embodiment described below, process 501 is performed by system 401 of FIG. 4.

Operations 502, 503 and 504 may be performed concurrently. In operation 502, metal oxyhalide material in solid or liquid form in a canister (413 or 417) is heated (with heating element 415 or 419) to a desired precursor temperature above the vapor temperature of the metal oxyhalide material to convert the metal oxyhalide into a gaseous form. In one embodiment, the desired precursor temperature is in the range of 35 C to 250 C, but may be at other temperatures in other embodiments, depending on the type of precursor material. In some embodiments, the metal oxyhalide material is heated under pressure in a canister in operation 502. Below is a table of melting points and/or vapor pressures of certain metal oxyhalides.

| Metal Oxyhalide | Melting point or, Vapor pressure |
|---|---|
| $HfOCl_2$ | <200 C. |
| $ZrOCl_2$ | 150 C. |
| $HfOBr_2$ | 120 C. |
| $La(ClO_4)_3$ | 55 C @ 86 Torr |
| $La(BrO_3)_3$ | 37.5 C. |
| $La(IO_3)_3$ | >800 C. |

In operation 503, chamber walls 404 are heated to a desired wall temperature. In one embodiment, the desired wall temperature is in the range of 100-200 C, but may be at other temperatures in other embodiments. The chamber walls 404 are heated to avoid the condensation of precursors and other materials on walls 404 during operation 505.

In operation 504, wafer 403 is heated with heating element 406 to a desired wafer temperature for operation 505. In one embodiment, the wafer temperature is in the range 250-450 C, but may be at other temperatures in other embodiments.

In operation 505, the metal oxyhalide in a gaseous form from a canister (413 or 417) is flowed into chamber 402 where it deposits on the surface of wafer 403 (the operation is referred to as a "pulse.") In one embodiment, metal oxyhalide is flowed into chamber 402 for a period of time long enough to deposit a predetermined amount of metal oxyhalide material on wafer 403 (e.g. in the range of 0.1 to 1 angstroms).

After operation 505, chamber 402 is purged with an inert gas in operation 507. If the metal oxyhalide that was deposited on wafer 403 in operation 505 was sourced from chamber 413, the inert gas for purging chamber 402 is provided from purge line 421. If the metal oxyhalide is sourced from chamber 417, then the inert gas is provided from purge line 425. Inert gases such as argon and nitrogen may be used for purging.

Operations 505 and 507 are successively performed for a number of times (e.g. 100) until a desired thickness of a metal oxyhalide layer on wafer 403 is reached. In some embodiments, metal oxyhalide material from both canisters 413 and 417 may be formed on wafer 403 during process 501. For example, in some embodiments, $HfOCl_2$ may be sourced from canister 413 and $ZrOCl_2$ may be sourced from canister 417. In such embodiments, a layer containing both zirconium oxide and hafnium oxide is formed (from the anneal operation 511) on wafer 403. In some embodiments, layers of the different metal oxyhalide materials can be formed during alternating pulse operations. In other embodiments, a layer of one metal oxyhalide material is formed by successive pulses (operation 505) and then a second layer of a second metal oxyhalide material is subsequently formed with successive pulses. In still other embodiments, two metal oxyhalide materials can be flowed into chamber 402 during a single pulse operation 505 where one material comes from canister 413 and the other comes from canister 417. In one embodiment, hafnium oxychloride is flowed from canister 413 and zirconium oxychloride is flowed from canister 417 concurrently during a pulse for multiple pulses to form a metal oxyhalide layer on wafer 403. In a subsequent anneal step, hafnium zirconate (HfxZr1-xO2) is formed from the metal oxyhalide layer.

In the embodiment shown, after a layer of metal oxyhalide is formed on wafer 403, the wafer is annealed by elevating the temperature of wafer 403 (e.g. with heating element 407) in operation 511. Annealing the wafer removes the halogens as well as other impurities from the layer and densifies the layer to a layer of metal oxides. It is believed that the annealing causes unreacted halogens to evaporate from the layer as well as causes the unreacted metal and oxygen to form a metal oxide. The anneal temperatures may also cause the metal oxyhalide molecules to break down, wherein the halogens are evaporated. The anneal operation is performed in the presence of an inert gas (e.g. argon, nitrogen). In some embodiments, the anneal temperatures may range from 350 C to 1100 C, but may be at other temperatures in other embodiments. In some embodiments, the anneal time maybe in the range of 1 second to 60 seconds, but may last for other time periods in other embodiments. The anneal temperature and time may depend upon the thickness and/or materials of the deposited metal oxyhalide layer. After the anneal operation 511, the chamber is purged with an inert gas in operation 513.

The process shown in FIG. 5 may be modified for other embodiments. For example, in some embodiments, an anneal operation (511) may follow each purge operation 507. Furthermore, in some embodiments, some of the operations of process 501 may be performed in different chambers or with different types of equipment. In other embodiments, process 501 may be performed with a different wafer processing system.

As stated above, forming a metal oxide layer from the deposition and anneal of a metal oxyhalide layer in some embodiments, may provide for a process that has less operations than with a conventional process that uses an oxidation precursor such $D_2O$, water or ozone. With some conventional processes, oxidation precursor pulses into the chamber and subsequent purge operations are utilized in forming the metal oxide layer. With at least some of the processes described herein, those extra operations may be eliminated.

Also, in some embodiments of the processes described herein, some of the operations can be performed at lower temperatures than with conventional metal oxide forming processes. For example, the melting temperature of a conventional metal oxide process precursor $HfCl_4$ is 330 C at atmospheric pressure, whereas the melting temperature of $HfOCl_2$ is less than 200 C. Accordingly, lower temperatures may be used.

In one embodiment, a method comprises forming a layer of metal oxyhalide on a wafer and after the forming, annealing the wafer to remove halogens from the layer. The method includes forming a semiconductor device from the wafer.

In another embodiment, a method includes forming a layer of metal oxyhalide on a wafer in a chamber. The forming a layer comprising performing a sequence of operations a plurality of times. The sequence of operations includes flowing a metal oxyhalide material in a gaseous form into the chamber with the wafer to deposit metal oxyhalide on the wafer and after the flowing, purging the chamber with an inert gas. The method includes after the forming the layer, annealing the wafer to remove halogens from the layer. After the annealing, the layer includes a metal oxide. The method includes forming a semiconductor device with the layer including the metal oxide.

Features shown or described with respect to one embodiment may be implemented with other embodiments shown or described herein. Features claimed in separate claims may be combined in any appropriate combinations to form other embodiments. While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:
forming a layer of metal oxyhalide on a wafer;
after the forming, annealing the wafer to remove halogens from the layer;
forming a semiconductor device from the wafer.

2. The method of claim 1 wherein the metal oxyhalide includes hafnium and the layer include hafnium.

3. The method of claim 1 wherein the metal oxyhalide includes zirconium.

4. The method of claim 1 wherein the metal oxyhalide includes lanthanum.

5. The method of claim 1 wherein the metal oxyhalide includes chlorine and the annealing includes removing chlorine from the layer.

6. The method of claim 1 wherein the metal oxyhalide s includes bromine and the annealing includes removing bromine form the layer.

7. The method of claim 1 wherein the metal oxyhalide includes iodine and the annealing includes removing iodine form the layer.

8. The method of claim 1 wherein the semiconductor device is characterized as a transistor and a portion of the layer is characterized as a gate dielectric layer of the transistor.

9. The method of claim 1 wherein the layer includes hafnium zirconate after the annealing.

10. The method of claim 1 wherein the forming the layer is includes flowing a metal oxyhalide material in a gaseous form into a wafer processing chamber for deposition on the wafer in the wafer processing chamber.

11. The method of claim 10 wherein prior to the flowing the metal oxyhalide in a gaseous form, heating the metal oxyhalide material to a temperature in a range 35-250 C.

12. The method of claim 11 further comprising heating the wafer to a temperature in a range of 250 C to 450 C during the forming the layer.

13. The method of claim 1 wherein the layer is formed on a layer of semiconductor oxide material of the wafer.

14. The method of claim 1 wherein the annealing includes heating the wafer to a temperature in a range of 350 C to 1100 C in the presence of an inert gas.

15. The method of claim 1 wherein the forming the layer includes flowing a metal oxyhalide material in a gaseous form in a chamber, wherein the annealing is performed while the wafer is in the chamber, the method further comprising after the flowing and before the annealing, purging the chamber with an inert gas, wherein the wafer is in the chamber during the purging.

16. The method of claim 15 wherein the forming the layer includes:
   flowing a metal oxyhalide material in a gaseous form in the chamber for a second time after the purging;
   purging the chamber for a second time after flowing the metal oxyhalide material in gaseous form for a second time, wherein the wafer is in the chamber during the purging for a second time.

17. The method of claim 16 wherein the flowing the metal oxyhalide material in the chamber includes flowing a metal oxyhalide material with a first metal, wherein the flowing a metal oxyhalide material in the chamber for a second time includes a flowing a metal oxyhalide material with a second metal different than the first metal.

18. The method of claim 17 wherein the first metal is one of zirconium and hafnium and the second metal is the other of zirconium and hafnium.

19. A method comprising:
   forming a layer of metal oxyhalide on a wafer in a chamber, the forming a layer comprising performing a sequence of operations a plurality of times, the sequence of operations comprising:
      flowing a metal oxyhalide material in a gaseous form into the chamber with the wafer to deposit metal oxyhalide on the wafer;
      after the flowing, purging the chamber with an inert gas;
   after the forming the layer, annealing the wafer to remove halogens from the layer, wherein after the annealing, the layer includes a metal oxide;
   forming a semiconductor device with the layer including the metal oxide.

20. The method of claim 19 wherein the semiconductor device is characterized as a transistor and a portion of the layer is characterized as a gate dielectric layer of the transistor.

* * * * *